US011320561B2

(12) United States Patent
Dong et al.

(10) Patent No.: US 11,320,561 B2
(45) Date of Patent: May 3, 2022

(54) MACHINE LEARNING FOR EVALUATING AND CATERGORIZING INVERSION SOLUTIONS

(71) Applicant: Halliburton Energy Services, Inc., Houston, TX (US)

(72) Inventors: Weixin Dong, Sugar Land, TX (US); Hsu Hsiang Wu, Sugar Land, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 129 days.

(21) Appl. No.: 16/639,829

(22) PCT Filed: Apr. 12, 2019

(86) PCT No.: PCT/US2019/027261
§ 371 (c)(1),
(2) Date: Feb. 18, 2020

(87) PCT Pub. No.: WO2020/209867
PCT Pub. Date: Oct. 15, 2020

(65) Prior Publication Data
US 2021/0132251 A1 May 6, 2021

(51) Int. Cl.
*G01V 3/38* (2006.01)
*G01V 3/30* (2006.01)
*G06F 30/27* (2020.01)

(52) U.S. Cl.
CPC .................. *G01V 3/38* (2013.01); *G01V 3/30* (2013.01); *G06F 30/27* (2020.01)

(58) Field of Classification Search
CPC ... G01V 3/38; G01V 3/30; G01V 3/28; G01V 3/026; G01V 3/18; G01V 3/00;
(Continued)

(56) References Cited

U.S. PATENT DOCUMENTS

| 5,886,526 A | * | 3/1999 | Wu ......................... G01V 3/30 |
| | | | 324/338 |
| 8,731,987 B2 | * | 5/2014 | Chen ....................... G01V 3/30 |
| | | | 705/7.12 |

(Continued)

FOREIGN PATENT DOCUMENTS

| EP | 2732315 | 3/2017 |
| WO | 2018148492 | 8/2018 |
| WO | 2018208281 | 11/2018 |

OTHER PUBLICATIONS

ISRWO International Search Report and Written Opinion for PCT/US2019/027261 dated Jan. 10, 2020.

*Primary Examiner* — Mohamed Charioui
(74) *Attorney, Agent, or Firm* — Benjamin Ford; C. Tumey Law Group PLLC

(57) ABSTRACT

A method for selecting initial models or inversion solutions during an inversion process from electromagnetic measurements may comprise disposing an electromagnetic well measurement system into a wellbore, transmitting electromagnetic fields into a formation with the electromagnetic transmitter, measuring the electromagnetic fields with the electromagnetic receiver as measurements at a depth in the wellbore, forming initial models for the inversion process based on the measurements and performing an inversion, filtering an inversion solution, forming a solution database from the filtered inversion solutions, building a reference model, calculating a similarity between the reference model and one or more models in the solution database, selecting one or more results from the solution database with the similarity larger than a threshold, and generating a final inversion model image from the one or more results. An electromagnetic well measurement system may comprise an electromagnetic transmitter antenna, an electromagnetic receiver antenna, and an information handling system.

20 Claims, 13 Drawing Sheets

(58) Field of Classification Search
CPC .......... G06F 30/27; G06F 30/20; G06F 30/00; G06N 20/00
See application file for complete search history.

(56) References Cited

U.S. PATENT DOCUMENTS

| | | |
|---|---|---|
| 9,846,256 B2 | 12/2017 | Heliot et al. |
| 2003/0055566 A1* | 3/2003 | Kriegshauser ........... G01V 3/28 702/7 |
| 2009/0204327 A1 | 8/2009 | Lu et al. |
| 2009/0306900 A1 | 12/2009 | Jing et al. |
| 2011/0264421 A1* | 10/2011 | Jing ......................... G01V 3/38 703/2 |
| 2012/0080197 A1 | 4/2012 | Dickens et al. |
| 2016/0047934 A1* | 2/2016 | Wang ....................... G01V 3/10 702/7 |
| 2017/0075030 A1 | 3/2017 | Wheelock |

* cited by examiner

MACHINE LEARNING FOR EVALUATING AND CATERGORIZING INVERSION SOLUTIONS

BACKGROUND

Wellbores drilled into subterranean formations may enable recovery of desirable fluids (e.g., hydrocarbons) using a number of different techniques. A logging tool may be employed in subterranean operations to determine wellbore and/or formation properties. Formation evaluation further from a wellbore is a critical step in reservoir characterization and monitoring. Logging tools typically measure the "near-field", or in the proximity of the wellbore. Logging tools are evolving to measure the "far-field", or large distances from the wellbore.

Logging tools may obtain geophysical and/or logging measurements for formation evaluation and monitoring. The geophysical and/or logging measurements may be altered through mathematical schemes, such as an inversion scheme, to determine formation characteristics. Currently, inversion schemes may utilize initial guess models that may be used to determine formation profiles surrounding logging tools. Using a many-initial-guess approach to inversion, inverted solutions may be calculated based on a deterministic inversion approach. But existing algorithm are not sufficient enough to evaluate bad or good solutions.

BRIEF DESCRIPTION OF THE DRAWINGS

These drawings illustrate certain aspects of some examples of the present disclosure and should not be used to limit or define the disclosure.

DETAILED DESCRIPTION

The present application is directed to subterranean operations and, more particularly, to methods and systems for well logging that use electromagnetic resistivity logging tools. At least one embodiment enables improved inversion for an ultra-deep electromagnetic resistivity logging tools for both shallow measurements and deep measurements. As disclosed below, machine learning methods may help in identifying similarities among solutions as well as to train an information handling system to recognize the best model from all solutions. Recalculating similarities among all inverted results may train the information handling machine to identify a best model or a most reliable mode.

Figure 1:
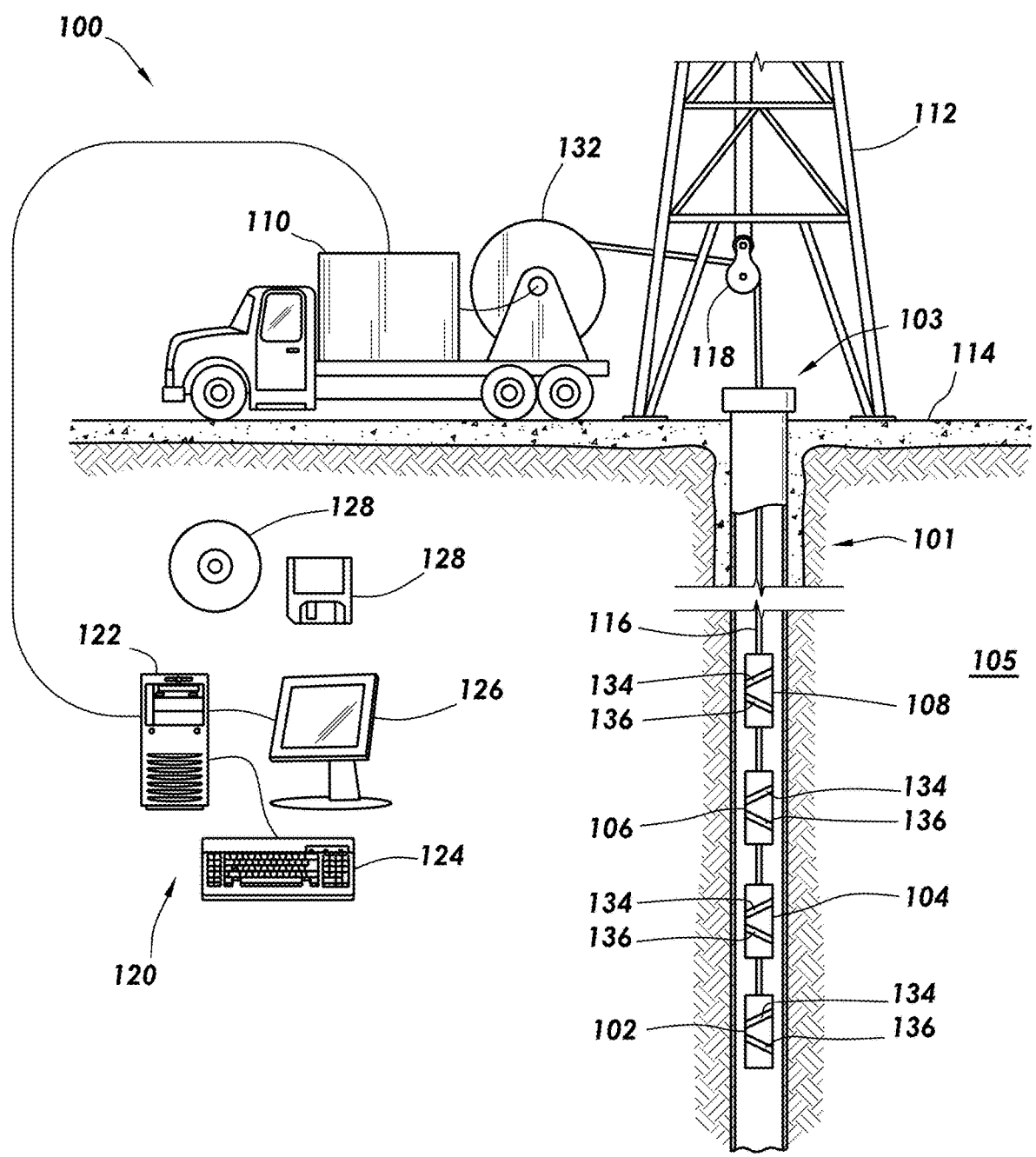
FIG. 1 illustrates an example of an electromagnetic well measurement system.

FIG. 1 illustrates a cross-sectional view of an electromagnetic well measurement system 100 which may be disposed in a wellbore 101. As illustrated, wellbore 101 may extend from a wellhead 103 into a subterranean formation 105 from surface 114. Generally, wellbore 101 may include horizontal, vertical, slanted, curved, and other types of wellbore geometries and orientations. Wellbore 101 may be cased or uncased. In examples, wellbore 101 may include a metallic material. By way of example, the metallic member may be a casing, liner, tubing, or other elongated steel tubular disposed in wellbore 101.

As illustrated, wellbore 101 may extend through subterranean formation 105. As illustrated in FIG. 1, wellbore 101 may extending generally vertically into the subterranean formation 105, however wellbore 101 may extend at an angle through subterranean formation 105, such as horizontal and slanted wellbores. For example, although FIG. 1 illustrates a vertical or low inclination angle well, high inclination angle or horizontal placement of the well and equipment may be possible. It should further be noted that while FIG. 1 generally depicts a land-based operation, those skilled in the art may recognize that the principles described herein are equally applicable to subsea operations that employ floating or sea-based platforms and rigs, without departing from the scope of the disclosure.

As illustrated, electromagnetic well measurement system 100 may include an electromagnetic induction tools may be used in a number of downhole induction tools operations, such as measuring-while-drilling (MWD), logging-while-drilling (LWD), wireline logging, and permanent monitoring operations. In examples, without limitation, tubulars may be disposed within the drill collar on a bottom hole assembly, a wireline tool mandrel, and/or permanently installed production casing. For brevity, the metallic tubular may be referred to as a downhole tool below. The electromagnetic antenna in the electromagnetic induction tool may be a magnetometer and/or an induction coil, which may reside on the downhole tool and/or outside. In examples, an electromagnetic source may be an electromagnetic antenna, which may be energized to produce an electromagnetic field. Where used, either the electromagnetic antenna and/or electromagnetic source may reside on the bottom hole assembly and/or outside, even on the surface.

Electromagnetic antennae may record voltages from electromagnetic fields induced by the electromagnetic source. Depending on details of the electromagnetic antenna's design and the size of the computation domain (e.g. mandrel and wellbore lengths) included in an inversion computation, it may take hours to a matter of days to fully compute recorded data from electromagnetic antenna(s). Without limitation, operations that may compute electric and/or magnetic fields may determine the distance and inclination of target well in ranging applications, bed resistivity and distances to bed boundaries in resistivity application, as well as distance to oil-water interface and resistivity change in waterflood monitoring application. Computation of the inversion may include a list of unknown parameters and the accuracy of these parameters may depend on the accuracy of a forward model. Forward models may include full-wave methods which may capture a mandrel (i.e., the supporting structured of the downhole tool) and the wellbore effect accurately.

Electromagnetic well measurement system may include a first downhole tool 102, a second downhole tool 104, a third downhole tool 106, and/or a fourth downhole tool 108 disposed on a conveyance, which may be lowered into wellbore 101. In examples, each downhole tool may be separated by about 1 foot (0.3 meter) to about 100 feet (30 meters), about twenty feet (6.096 meters) to about 200 feet (61 meters), or about 50 feet (15 meters) to about 100 (30 meters). It should be noted that electromagnetic well measurement system 100 may include first downhole tool 102. In additional examples, there may be a plurality of downhole tools, such as first downhole tool 102. As illustrated, first downhole tool 102, second downhole tool 104, third downhole tool 106, and/or fourth downhole tool 108 may attach to a vehicle 110. In examples, it should be noted that first downhole tool 102, second downhole tool 104, third downhole tool 106, and/or fourth downhole tool 108 may not be attached to a vehicle 110. First downhole tool 102, second downhole tool 104, third downhole tool 106, and/or fourth downhole tool 108 may be supported by rig 112 at surface 114. First downhole tool 102, second downhole tool 104, third downhole tool 106, and/or fourth downhole tool 108 may be tethered to vehicle 110 through conveyance 116. Conveyance 116 may be disposed around one or more sheave wheels 118 to vehicle 110. Conveyance 116 may include any suitable means for providing mechanical conveyance for first downhole tool 102, second downhole tool 104, third downhole tool 106, and/or fourth downhole tool 108, including, but not limited to, wireline, slickline, coiled tubing, pipe, drill pipe, downhole tractor, or the like. In some embodiments, conveyance 116 may provide mechanical suspension, as well as electrical connectivity, for first downhole tool 102, second downhole tool 104, third downhole tool 106, and/or fourth downhole tool 108. Conveyance 116 may include, in some instances, a plurality of electrical conductors extending from vehicle 110. Conveyance 116 may include an inner core of several electrical conductors covered by an insulating wrap. An inner and outer steel armor sheath may be wrapped in a helix in opposite directions around the conductors. The electrical conductors may be used for communicating power and telemetry between vehicle 110 and first downhole tool 102, second downhole tool 104, third downhole tool 106, and/or fourth downhole tool 108. Information from first downhole tool 102, second downhole tool 104, third downhole tool 106, and/or fourth downhole tool 108 may be gathered and/or processed by information handling system 120. For example, signals recorded by first downhole tool 102, second downhole tool 104, third downhole tool 106, and/or fourth downhole tool 108 may be stored on memory and then processed by first downhole tool 102, second downhole tool 104, third downhole tool 106, and/or fourth downhole tool 108. The processing may be performed real-time during data acquisition or after recovery of first downhole tool 102, second downhole tool 104, third downhole tool 106, and/or fourth downhole tool 108. Processing may alternatively occur downhole or may occur both downhole and at surface. In some embodiments, signals recorded by first downhole tool 102, second downhole tool 104, third downhole tool 106, and/or fourth downhole tool 108 may be conducted to information handling system 120 by way of conveyance 116. Information handling system 120 may process the signals, and the information contained therein may be displayed for an operator to observe and stored for future processing and reference. Information handling system 120 may also contain an apparatus for supplying control signals and power to first downhole tool 102, second downhole tool 104, third downhole tool 106, and/or fourth downhole tool 108.

Systems and methods of the present disclosure may be implemented, at least in part, with information handling system 120. Information handling system 120 may include any instrumentality or aggregate of instrumentalities operable to compute, estimate, classify, process, transmit, receive, retrieve, originate, switch, store, display, manifest, detect, record, reproduce, handle, or utilize any form of information, intelligence, or data for business, scientific, control, or other purposes. For example, an information handling system 120 may be a personal computer, a network storage device, or any other suitable device and may vary in size, shape, performance, functionality, and price. Information handling system 120 may include random access memory (RAM), one or more processing resources such as a central processing unit (CPU) 122 or hardware or software control logic, ROM, and/or other types of nonvolatile memory. Additional components of the information handling system 120 may include one or more disk drives, one or more network ports for communication with external devices as well as an input device 124 (e.g., keyboard, mouse, etc.) and output devices, such as a video display 126. Information handling system 120 may also include one or more buses operable to transmit communications between the various hardware components.

Alternatively, systems and methods of the present disclosure may be implemented, at least in part, with non-transitory computer-readable media 128. Non-transitory computer-readable media 128 may include any instrumentality or aggregation of instrumentalities that may retain data and/or instructions for a period of time. Non-transitory computer-readable media 128 may include, for example, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

In examples, rig 112 includes a load cell (not shown) which may determine the amount of pull on conveyance 116 at the surface of wellbore 101. Information handling system 120 may include a safety valve which controls the hydraulic pressure that drives drum 132 on vehicle 110 which may reel up and/or release conveyance 116 which may move first downhole tool 102, second downhole tool 104, third downhole tool 106, and/or fourth downhole tool 108 up and/or down wellbore 101. The safety valve may be adjusted to a pressure such that drum 132 may only impart a small amount of tension to conveyance 116 over and above the tension necessary to retrieve conveyance 116 and/or first downhole tool 102, second downhole tool 104, third downhole tool 106, and/or fourth downhole tool 108 from wellbore 101. The safety valve is typically set a few hundred pounds above the amount of desired safe pull on conveyance 116 such that once that limit is exceeded; further pull on conveyance 116 may be prevented.

In examples, first downhole tool 102, second downhole tool 104, third downhole tool 106, and/or fourth downhole tool 108 may include an electromagnetic transmitter 134 and/or an electromagnetic receiver 136. It should be noted each downhole tool may include a plurality of electromagnetic transmitters 134 and/or a plurality of electromagnetic receivers 136. The plurality of electromagnetic transmitters 134 and the plurality of electromagnetic receiver 136 may be disposed along a longitudinal axis of any downhole tool. As disclosed, the concepts that are described herein are valid for any type of electromagnetic transmitters 134 and electromagnetic receiver 136. As an example, wire antenna, toroidal antenna and/or azimuthal button electrodes, electromagnetic transmitter coils, and/or electromagnetic receiver coils may also be used in the place of the electromagnetic transmitters 134 and/or electromagnetic receiver 136. In some examples, electromagnetic receiver 136 may include an electromagnetic transmitter, an electromagnetic receiver, or a transceiver. Without limitation, electromagnetic transmitters 134 and/or electromagnetic receiver 136 may be disposed on and/or adjacent to a gap sub. In examples, there may be more than one gap sub in which electromagnetic transmitters 134 and/or electromagnetic receiver 136 may be disposed on and/or adjacent to.

Additionally, electromagnetic transmitter 134 may operate and function to broadcast an electromagnetic field. In examples, electromagnetic transmitter 134 may broadcast a low frequency electromagnetic field and/or a high frequency electromagnetic field. A low frequency electromagnetic field, wherein the low frequency electromagnetic field may range from about 1 KHz to about 250 KHz. Electromagnetic transmitter 134 may also broadcast a high frequency electromagnetic field, which may range from about 250 KHz to about 2 MHz. Electromagnetic transmitter 134 may broadcast the high frequency electromagnetic field and the low frequency electromagnetic field on any number of frequencies along any number of channels sequentially and/or simultaneously on the same antenna and/or multiple antennas. In examples, first downhole tool 102, second downhole tool 104, third downhole tool 106, and/or fourth downhole tool 108 may operate with additional equipment (not illustrated) on surface 114 and/or disposed in a separate electromagnetic well measurement system (not illustrated) to record measurements and/or values from formation 105. During operations, electromagnetic transmitter 134 may broadcast the high frequency electromagnetic field or the low frequency electromagnetic field from first downhole tool 102, second downhole tool 104, third downhole tool 106, and/or fourth downhole tool 108. Electromagnetic transmitter 134 may be connected to information handling system 120, which may further control the function and/or operation of electromagnetic transmitter 134. Additionally, electromagnetic receiver 136 may measure and/or record electromagnetic fields broadcasted from electromagnetic transmitter 134. Electromagnetic receiver 136 may transfer recorded information to information handling system 120. Information handling system 120 may control the operation of electromagnetic receiver 136. For example, the broadcasted electromagnetic field from electromagnetic transmitter 134 may be altered (i.e., in phase and attenuation, and/or the like) by formation 105, which may be sensed, measured, and/or recorded by electromagnetic receiver 136. It should be noted that electromagnetic transmitter 134 and electromagnetic receiver 136 may be the same antenna, coil, toroid, and/or the like. The recorded signal may be transferred to information handling system 120 for further processing.

In examples, there may be any suitable number of electromagnetic transmitters 134 and/or electromagnetic receivers 136, which may be controlled by information handling system 120. Information and/or measurements may be processed further by information handling system 120 to determine properties of wellbore 101, fluids, and/or formation 105.

Figure 2:
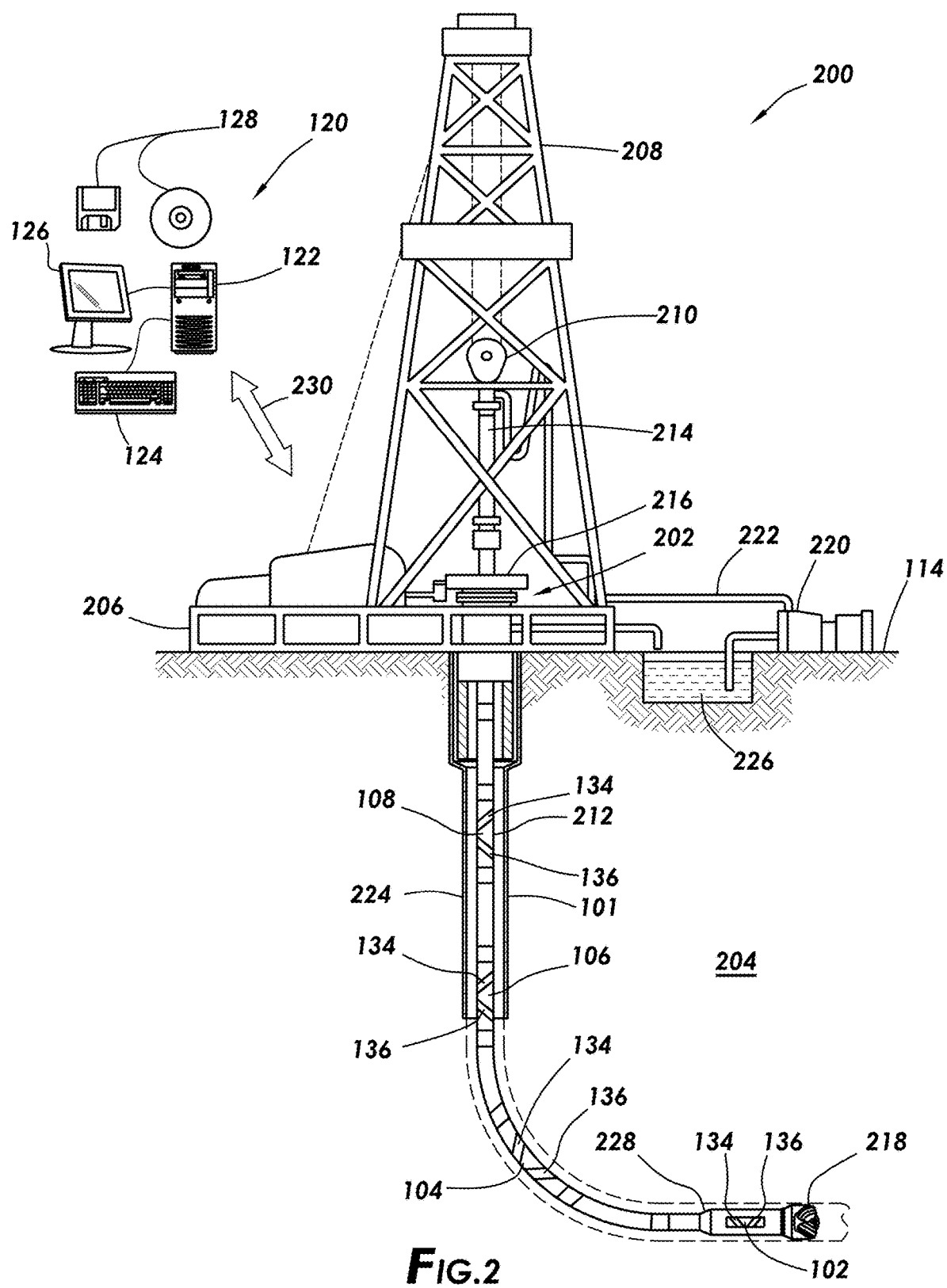
FIG. 2 illustrates another example of an electromagnetic well measurement system.

FIG. 2 illustrates an example in which first downhole tool 102, second downhole tool 104, third downhole tool 106, and/or fourth downhole tool 108 may be disposed in wellbore 101 through a drilling system 200. As illustrated, drilling system 200 may include a drilling platform 206 may support a derrick 208 having a traveling block 210 for raising and lowering drill string 212. Drill string 212 may include, but is not limited to, drill pipe and coiled tubing, as generally known to those skilled in the art. A kelly 214 may support drill string 212 as it may be lowered through a rotary table 216. A drill bit 218 may be attached to the distal end of drill string 212 and may be driven either by a downhole motor and/or via rotation of drill string 212 from surface 114. Without limitation, drill bit 218 may include, roller cone bits, PDC bits, natural diamond bits, any hole openers, reamers, coring bits, and the like. As drill bit 218 rotates, it may create and extend wellbore 101 that penetrates various subterranean formations 204. A pump 220 may circulate drilling fluid through a feed pipe 222 to kelly 214, downhole through interior of drill string 212, through orifices in drill bit 218, back to surface 114 via annulus 224 surrounding drill string 212, and into a retention pit 226.

With continued reference to FIG. 2, drill string 212 may begin at wellhead 202 and may traverse wellbore 101. Drill bit 218 may be attached to a distal end of drill string 212 and may be driven, for example, either by a downhole motor and/or via rotation of drill string 212 from surface 114. Drill bit 218 may be a part of bottom hole assembly 228 at distal end of drill string 212. Bottom hole assembly 228 may further include first downhole tool 102. First downhole tool 102 may be disposed on the outside and/or within bottom hole assembly 228. It should be noted that second downhole tool 104, third downhole tool 106, and/or fourth downhole tool 108 may be disposed on drill string 212. Second downhole tool 104, third downhole tool 106, and/or fourth downhole tool 108 may be disposed on the outside and/or within drill string 212. First downhole tool 102, second downhole tool 104, third downhole tool 106, and/or fourth downhole tool 108 may include an electromagnetic transmitter 134 and/or an electromagnetic receiver 136. It should be noted that first downhole tool 102, second downhole tool 104, third downhole tool 106, and/or fourth downhole tool 108 may include a plurality of electromagnetic transmitters 134 and/or electromagnetic receivers 136. Electromagnetic transmitters 134 and/or electromagnetic receivers 136 may operate and/or function as described above. As will be appreciated by those of ordinary skill in the art, first downhole tool 102, second downhole tool 104, third downhole tool 106, and/or fourth downhole tool 108 may be a measurement-while drilling (MWD) or logging-while-drilling (LWD) system.

Without limitation, first downhole tool 102, second downhole tool 104, third downhole tool 106, and/or fourth downhole tool 108, electromagnetic transmitters 134, and/or electromagnetic receiver 136 may be connected to and/or controlled by information handling system 120, which may be disposed on surface 114. Without limitation, information handling system 120 may be disposed down hole in first downhole tool 102, second downhole tool 104, third downhole tool 106, and/or fourth downhole tool 108. Processing of information recorded may occur down hole and/or on surface 114. Processing occurring downhole may be transmitted to surface 114 to be recorded, observed, and/or further analyzed. Additionally, information recorded on information handling system 120 that may be disposed down hole may be stored until first downhole tool 102, second downhole tool 104, third downhole tool 106, and/or fourth downhole tool 108 may be brought to surface 114. In examples, information handling system 120 may communicate with first downhole tool 102, second downhole tool 104, third downhole tool 106, and/or fourth downhole tool 108 through a communication line (not illustrated) disposed in (or on) drill string 212. In examples, wireless communication may be used to transmit information back and forth between information handling system 120 and first downhole tool 102, second downhole tool 104, third downhole tool 106, and/or fourth downhole tool 108. Information handling system 120 may transmit information to first downhole tool 102, second downhole tool 104, third downhole tool 106, and/or fourth downhole tool 108 and may receive as well as process information recorded by first downhole tool 102, second downhole tool 104, third downhole tool 106, and/or fourth downhole tool 108. In examples, a downhole information handling system (not illustrated) may include, without limitation, a microprocessor or other suitable circuitry, for estimating, receiving and processing signals from first downhole tool 102, second downhole tool 104, third downhole tool 106, and/or fourth downhole tool 108. Downhole information handling system (not illustrated) may further include additional components, such as memory, input/output devices, interfaces, and the like. In examples, while not illustrated, first downhole tool 102, second downhole tool 104, third downhole tool 106, and/or fourth downhole tool 108 may include one or more additional components, such as analog-to-digital converter, filter and amplifier, among others, that may be used to process the measurements of first downhole tool 102, second downhole tool 104, third downhole tool 106, and/or fourth downhole tool 108 before they may be transmitted to surface 114. Alternatively, raw measurements from first downhole tool 102, second downhole tool 104, third downhole tool 106, and/or fourth downhole tool 108 may be transmitted to surface 114.

Any suitable technique may be used for transmitting signals from first downhole tool 102, second downhole tool 104, third downhole tool 106, and/or fourth downhole tool 108 to surface 114, including, but not limited to, wired pipe telemetry, mud-pulse telemetry, acoustic telemetry, and electromagnetic telemetry. While not illustrated, first downhole tool 102, second downhole tool 104, third downhole tool 106, and/or fourth downhole tool 108 may include a telemetry subassembly that may transmit telemetry data to surface 114. Without limitation, an electromagnetic source in the telemetry subassembly may be operable to generate pressure pulses in the drilling fluid that propagate along the fluid stream to surface 114. At surface 114, pressure transducers (not shown) may convert the pressure signal into electrical signals for a digitizer (not illustrated). The digitizer may supply a digital form of the telemetry signals to information handling system 120 via a communication link 230, which may be a wired or wireless link. The telemetry data may be analyzed and processed by information handling system 120.

As illustrated, communication link 230 (which may be wired or wireless, for example) may be provided that may transmit data from first downhole tool 102, second downhole tool 104, third downhole tool 106, and/or fourth downhole tool 108 to an information handling system 120 at surface 114. Information handling system 120 may include a central processing unit 122, a video display 126, an input device 124 (e.g., keyboard, mouse, etc.), and/or non-transitory computer-readable media 128 (e.g., optical disks, magnetic disks) that may store code representative of the methods described herein. In addition to, or in place of processing at surface 114, processing may occur downhole.

First downhole tool 102, second downhole tool 104, third downhole tool 106, and/or fourth downhole tool 108 may include an electromagnetic transmitter 134 and/or an electromagnetic receiver 136. In examples, first downhole tool 102, second downhole tool 104, third downhole tool 106, and/or fourth downhole tool 108 may operate with additional equipment (not illustrated) on surface 114 and/or disposed in a separate electromagnetic well measurement system (not illustrated) to record measurements and/or values from subterranean formation 204. During operations, electromagnetic transmitter 134 may broadcast an electromagnetic field from first downhole tool 102, second downhole tool 104, third downhole tool 106, and/or fourth downhole tool 108. Electromagnetic transmitter 134 may be connected to information handling system 120, which may further control the function and/or operation of electromagnetic transmitter 134. Additionally, electromagnetic receiver 136 may sense, measure, and/or record electromagnetic fields broadcasted from electromagnetic transmitter 134. Electromagnetic receiver 136 may transfer recorded information to information handling system 120. Information handling system 120 may control the operation of electromagnetic receiver 136. For example, the broadcasted electromagnetic field from electromagnetic transmitter 134 may be altered (i.e., in phase and attenuation, and/or the like) by subterranean formation 204. The altered electromagnetic field may be recorded by electromagnetic receiver 136 and may be transferred to information handling system 120 for further processing. In examples, there may be any suitable number of electromagnetic transmitters 134 and/or electromagnetic receivers 136, which may be controlled by information handling system 120. Information and/or measurements may be processed further by information handling system 120 to determine properties of wellbore 101, fluids, and/or subterranean formation 204.

During electromagnetic logging operations, deep electromagnetic measurements, which may be found using low frequency electromagnetic fields, may be fed into an inversion together with shallow measurements, which may be found using high frequency electromagnetic fields. The inversion may produce a formation resistivity model. Without limitations, deep electromagnetic measurements may be measurements that may be able to measure formation properties that are more than 100 feet away and shallow electromagnetic measurements may be measurements that are sensitive to formation properties within a range of about 100 feet (30 meters).

In examples, the inversion may be a general inversion which uses minimization algorithms to find a formation model that may fit the measurements. The inversion assumes a 1D layered model within a designated area, identified as a variable "X," above and below the wellbore. The number "X" is the depth of investigation which is proportional to tool spacing. In examples, "X" may vary from several feet to several hundred feet. For deep measurements a low frequency signal may be used with a depth of investigation that may be more about 100 feet (30 meters) to about 500 feet (152 meters). It should be noted that long spacing between an electromagnetic transmitter 134 and an electromagnetic receiver 136 (e.g., referring to FIG. 1) may be from about 20 feet (6 meters) to about 200 feet (61 meters). However, for shallow measurements a high frequency signal may be used with a depth of investigation that may be shorter from about 1 foot (0.3 meter) to about 100 feet (30 meters). It should be not that short spacing between an electromagnetic transmitter 134 and an electromagnetic receiver 136 (e.g., referring to FIG. 1) may be about 1 foot (0.3 meter) to about 20 feet (6 meters).

In a second example, a multi-step inversion may be implemented to preserve high resolution near wellbore 101 (e.g., referring to FIGS. 1 and 2) while being able to detect the formation boundaries at a distance. This method may use a multi-step inversion. For example, in the multi-step inversion the shallow measurement may be inverted, and the results may be fed into a second inversion using deep measurements to find a formation resistivity model. This inversion scheme may be updated when an operator selects initials guesses based on the previous inversion results to improve quality of the formation resistivity model. Without limitation, machine learning may improve the results of an inversion and/or a multi-step inversion.

For example, machine learning may be utilized to identify the similarities among inversion solutions as well as to train information handling system 120 (e.g., referring to FIGS. 1 and 2) to recognize a model that may fit all solutions. Currently, color visualization may be used to present inversion results (i.e., the formation resistivity profiles) surrounding first downhole tool 102, second downhole tool 104, third downhole tool 106, and/or fourth downhole tool 108. But different color scale range on overall inversion results may present different geological information and emphasis on different geological structures at different locations. Therefore, recalculating the similarities among all inverted results using different color scale range may train information handling system 120 to identify a best model or a reliable model. A guide-model inversion may be also implemented to further train information handling system 120.

Figure 3:
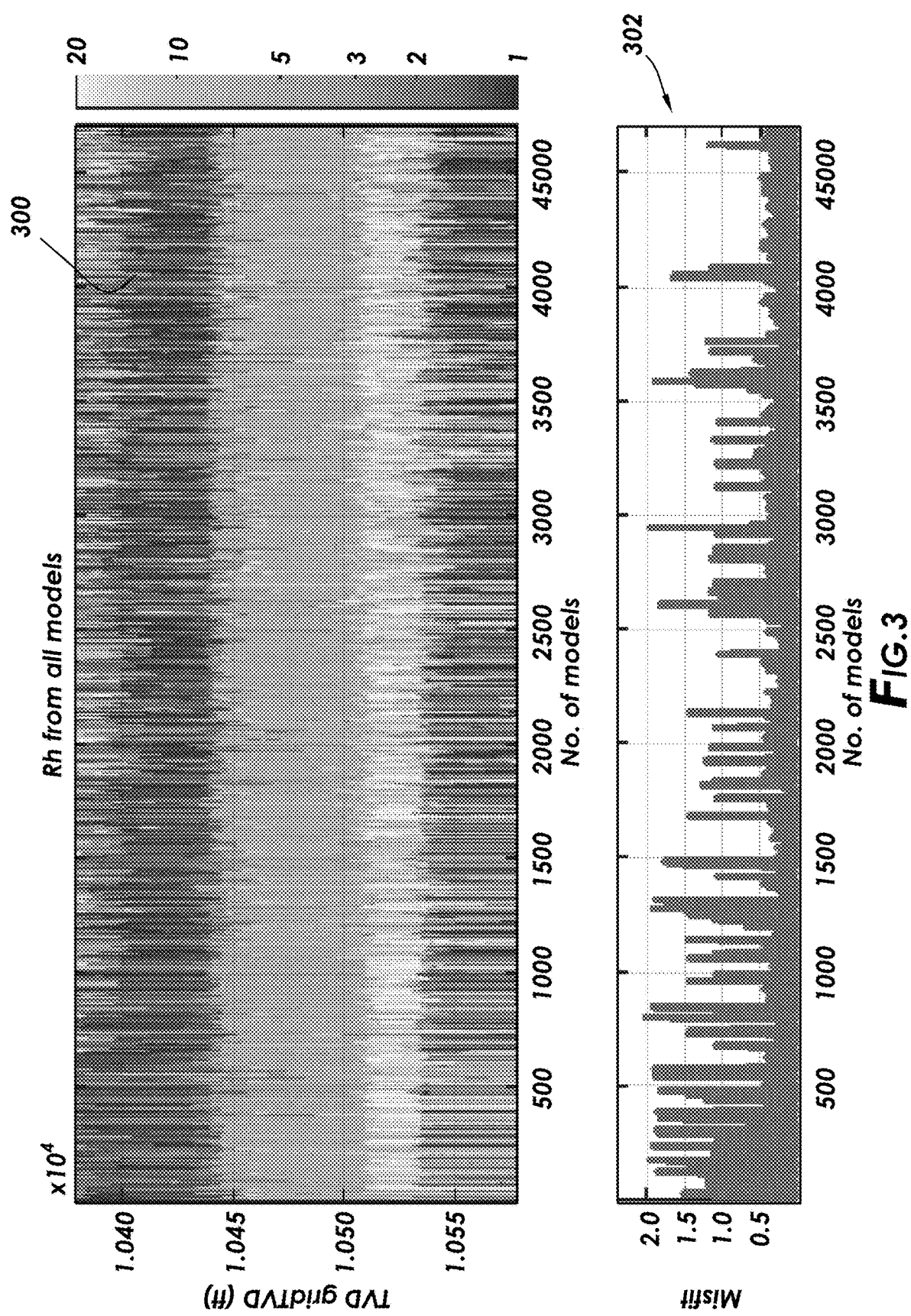
FIG. 3 illustrates a plot of a through inversion results at a depth.
Figure 4:
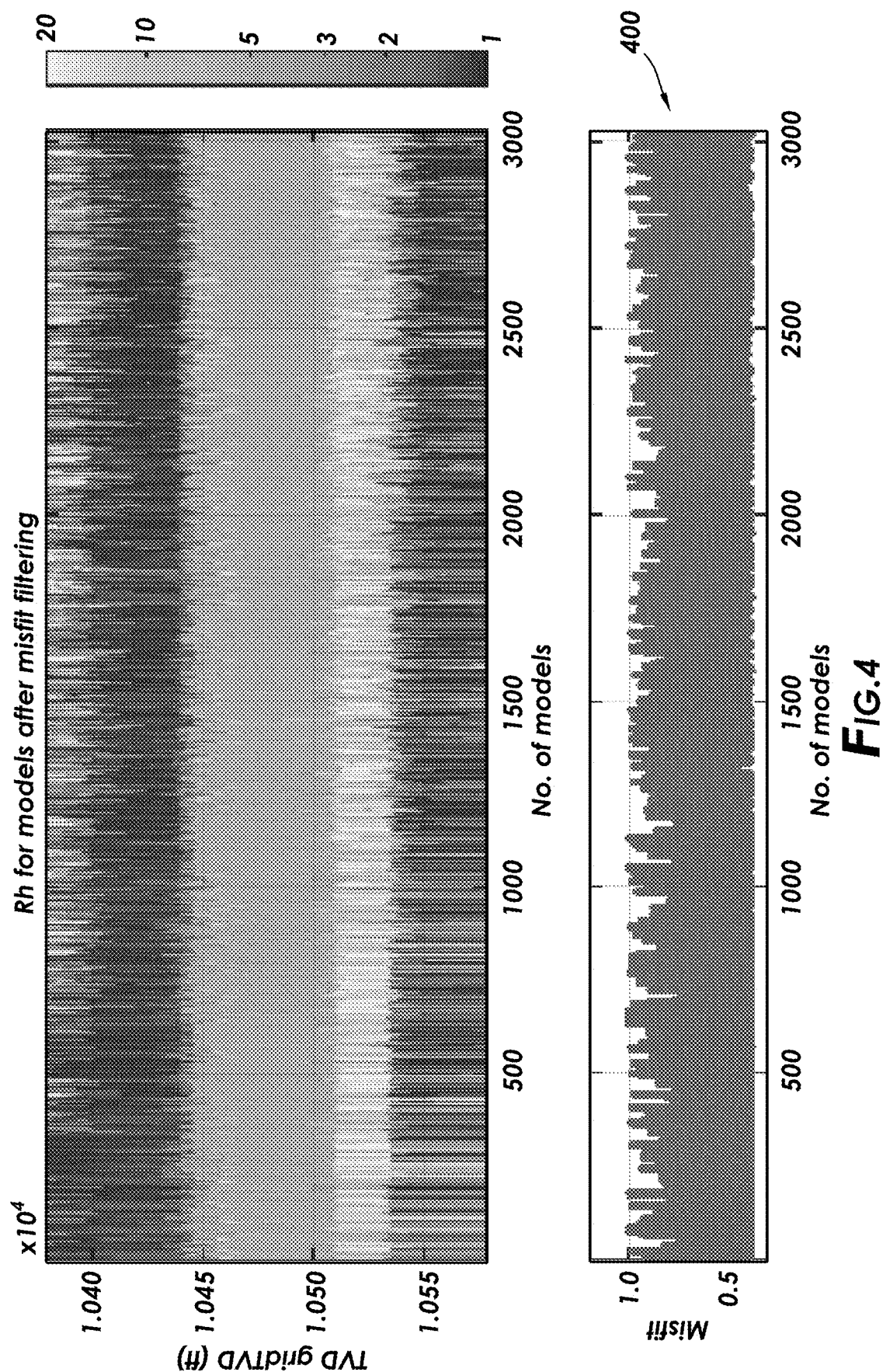
FIG. 4 illustrates a plot of results after filtering by a misfit process at a depth.

Deep measurements used in invers may have large DOI and various formation models may fit the deep measurements. In examples, inversion at one depth starts from hundreds to thousands of initial guesses and converges to the same amount of results. FIG. 3 is a graph plotting several thousand inversion results. Each vertical stripe 300 in the graph may be colored, which may help visualize each and every inversion result. A misfit plot 302 is shown below and may correspond to each solution. The horizontal resistivity (Rh) value in ohm·m is represented by represented in different colors according to a color bar at each TVD grid which width is about 1 foot. The original range of Rh may be between about 0.1 to about 1000 Ohm. The Rh values may be scaled within a certain range and may be represented by an appropriate color map so that the visualization of the solutions may represent the geometry of formation 105. Without limitation, FIG. 3 applies a logarithm scale to Rh from about 1 to about 20 Ohm·m. Before further processing, those results with large misfit which are more than three times bigger than the minimum misfit are discarded, in which three is the misfit threshold that can be changed based on user's experiences. FIG. 4 illustrated a plot with remaining results filtered by a misfit process discussed above.

Figure 5:
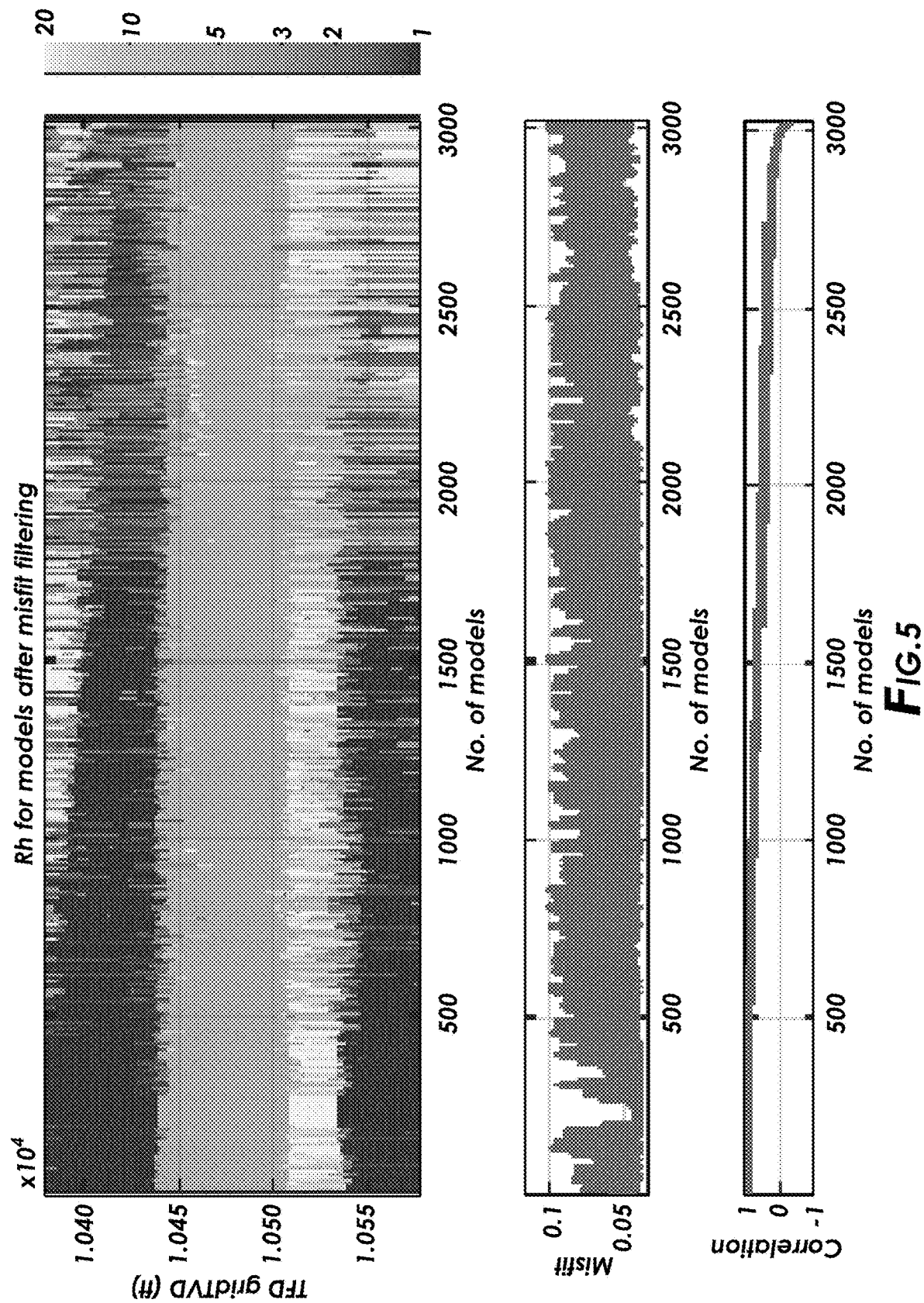
FIG. 5 illustrates a plot of sorted inversion results based on similarity at a depth.

With continued reference to FIG. 4, current techniques for processing deep measurements may calculate the median or average of all the remaining solutions that were filtered by a misfit process. The results from the calculating the median and/or average may be the final inversion result at that depth. However, the results may not reflect the geology of formation 105 (e.g., referring to FIG. 1). As illustrated in FIG. 4, misfit plot 400 shows that mathematically each solution that was filtered by a misfit process has a small misfit less than the misfit threshold, but each solution may have a different geological pattern in terms of resistivity and boundary. To sort the solutions into one or more groups, a geology model may be picked as a reference model and all the solutions are sorted by their similarity to the identified reference model. FIG. 5 shows the sorted solutions according to their median, which is used as the reference model in this case. This reference model processing may illustrate four or more geology patterns. Then those solutions with similarity larger than a defined threshold to the reference model are selected to generate the final inversion output by taking their median or average. The reference model may be median, average, filtered results by peak boundaries, or any other defined model based on available information of the geology of formation 105.

It should be noted that instead of outputting only one solution, multiple solutions may also be output at one depth without using a reference model, described above. In examples, all solutions after misfit filtering may be grouped based on similarity to each solution. For example, models with similarities larger than a defined threshold stay in one group, so all solutions may be divided into one or more groups. Groups with more solutions (usually containing at least 30% of all solutions) than other groups may be identified as major groups. The median or average of each major group may be possible solutions at that depth.

Figure 6:
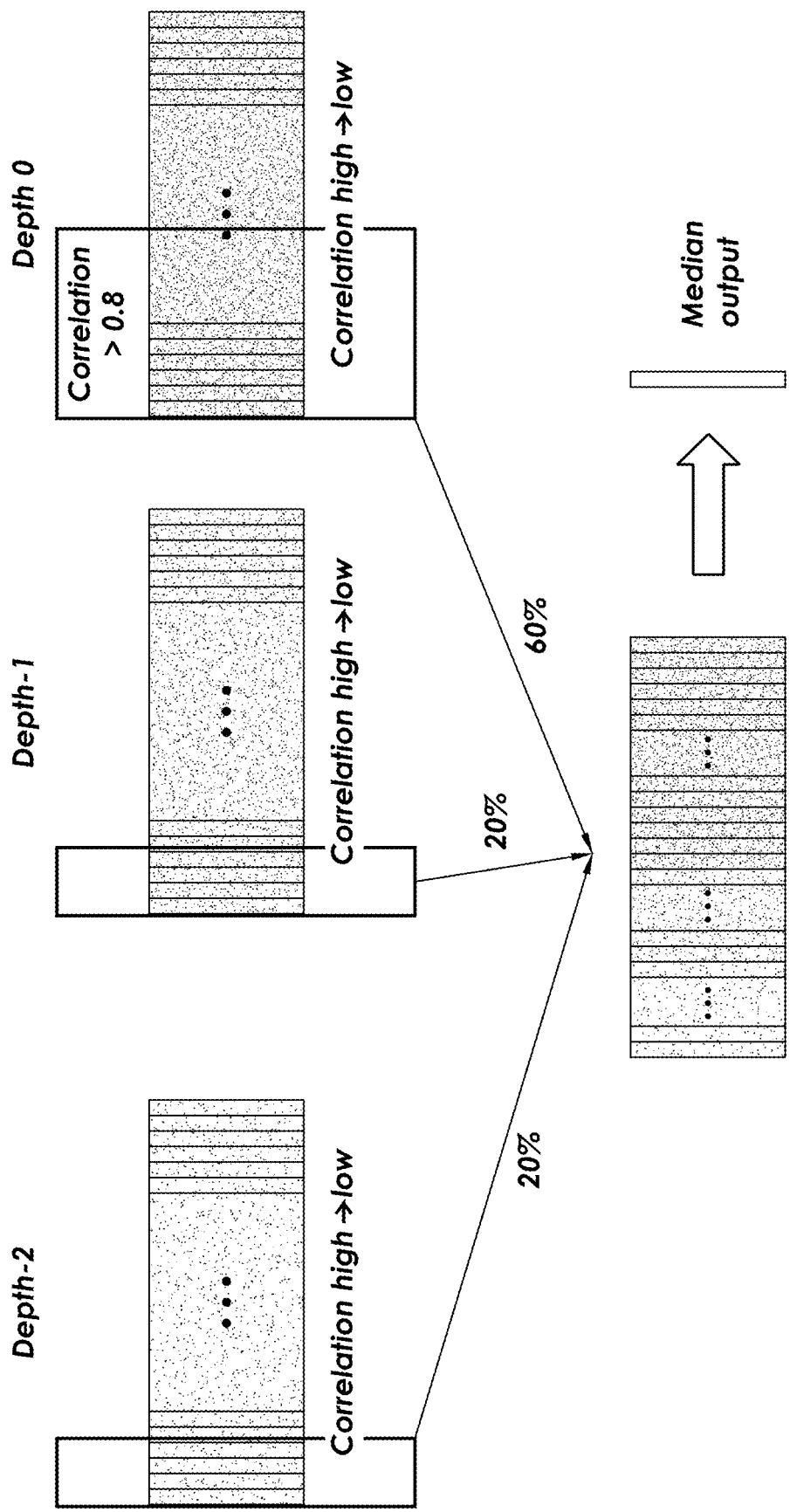
FIG. 6 illustrates a diagram of selecting results at a depth according to their similarity to solution of current previous depths.
Figure 7:
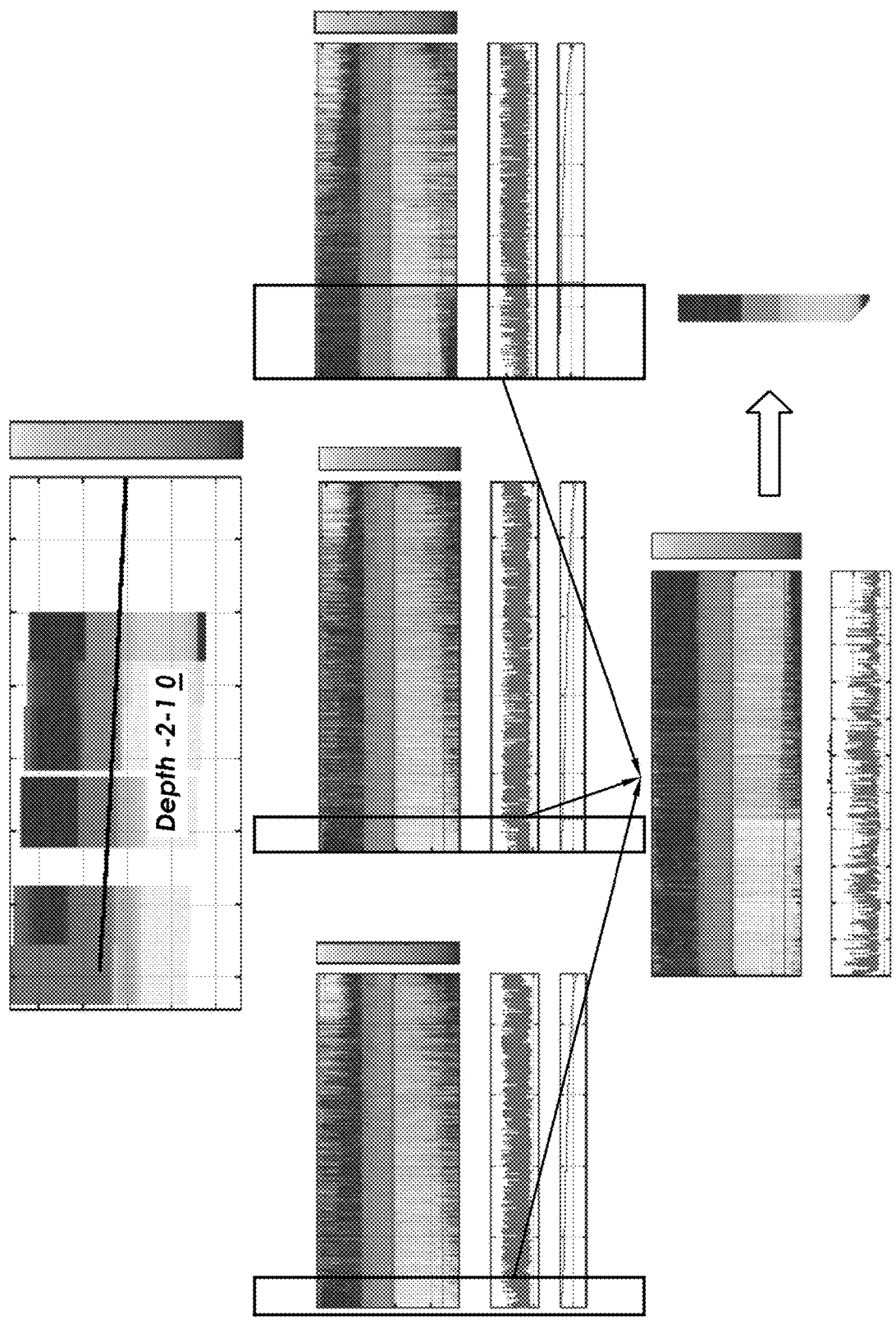
FIG. 7 illustrates selecting and combining sorted results according to their similarity to the solution at each depth and generate the solution at a current depth.

Expanding the processing from one depth to multiple consecutive depths, continuity may be used to refine results for all depths. Considering the geological continuity along logging depths, Similarities to the final solution at several depths before the current depth may be counted with certain weights for selecting the most relevant solutions at current depth. It should be noted that similar calculations between different depths may be considered a reasonable depth shift (usually +−5 ft depending on the MD interval) in TVD direction. For example, FIG. 6 and FIG. 7 show the diagrams and solutions for processing results at depth 0 using both similarity and continuity. The results at depth 0 are sorted based at least in part on similarity to a reference model at current depth and to the final solution at depth −1 and depth −2 respectively. Solutions with higher similarity to each depth may be selected with weighted percentage (e.g. 80% from the group similar to depth 0, 20% from the group similar to depth −1 and 20% from the group similar to depth −2) to generate the final solution at depth 0.

Figure 8:
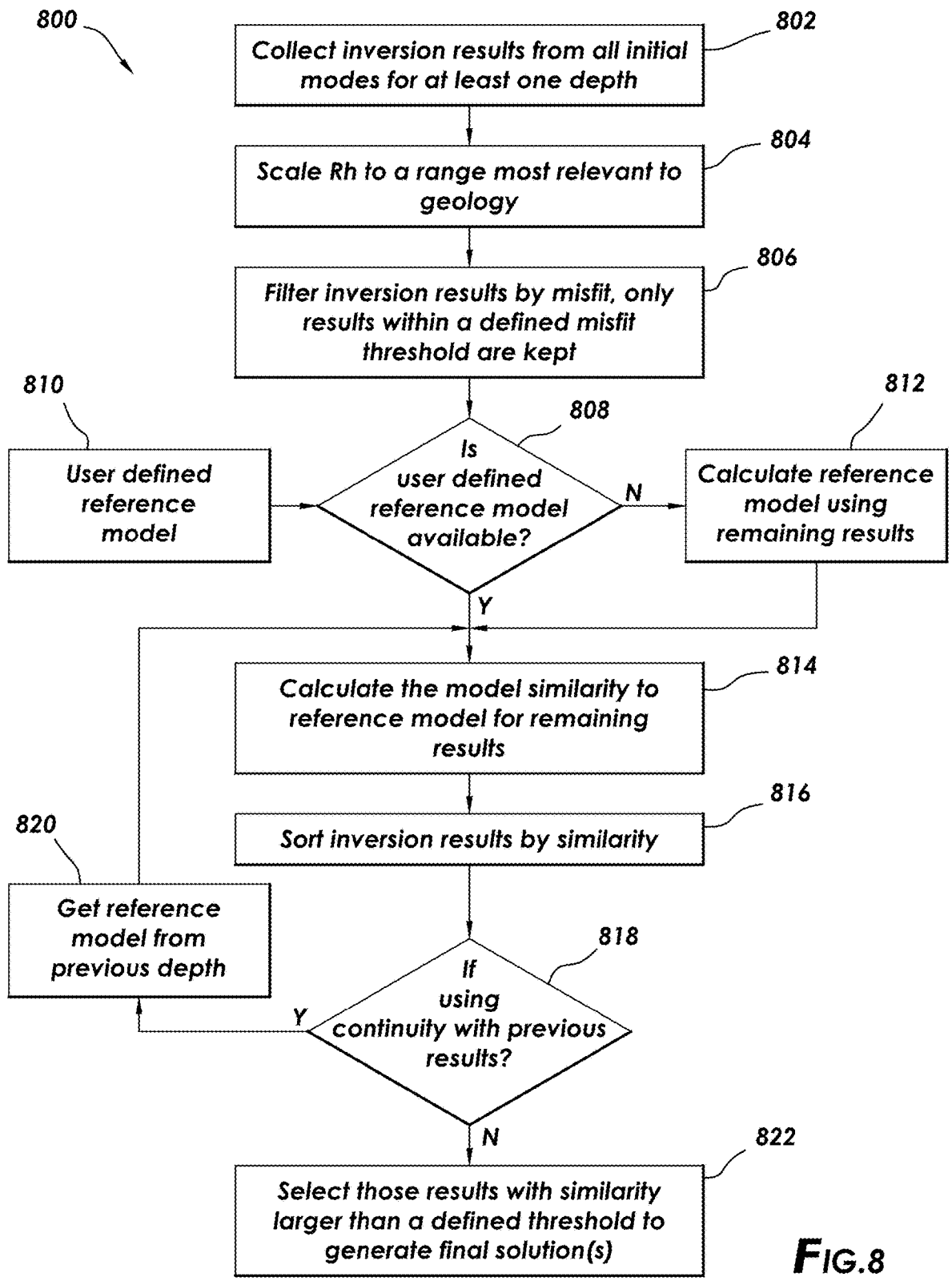
FIG. 8 illustrates a machine learning flowchart 800.

FIG. 8 is machine learning flowchart 800 for the inversion results processing using similarity for one and more depths. Flowchart 800 may begin with block 802. In block 802, information handling system 120 (e.g., referring to FIG. 1) may collect inversion results from all initial modes for at least one depth. In block 804, the collected inversion results may scale Rh to a range relevant to geology (e.g. on a logarithm scale between the minimum and maximum resistivity of the geology). In block 806, the inversion results from block 806 are filtered by a misfit process and results within a defined misfit threshold, as described above, are kept. In block 808, information handling system 120 may see if a user defined reference model based on geology information from other tools and technologies is available. In block 810, a user defined reference model may be input into information handling system 120. If no reference model is input from block 810, in block 812 information handling system 120 may calculate reference model using remaining results. If a reference model is input into information handling system 120 by block 810, in block 814 information handling system 120 may calculate the model similarity to the reference model for remaining results. Calculating the model similarity may include calculating the digital differences between two vectors considering the two vectors contain resistivity values in the same TVD grids. In block 816, the inversion results are sorted by similarity. In block 818, information handling system 120 checks to see if there is a continuation with previous depths. If there is continuity, in block 820 a reference model from a previous depth is chosen. If there is no continuity, in block 822 information handling system 120 selects those results with similarity larger than a defined threshold to generate final solutions.

Figure 9:
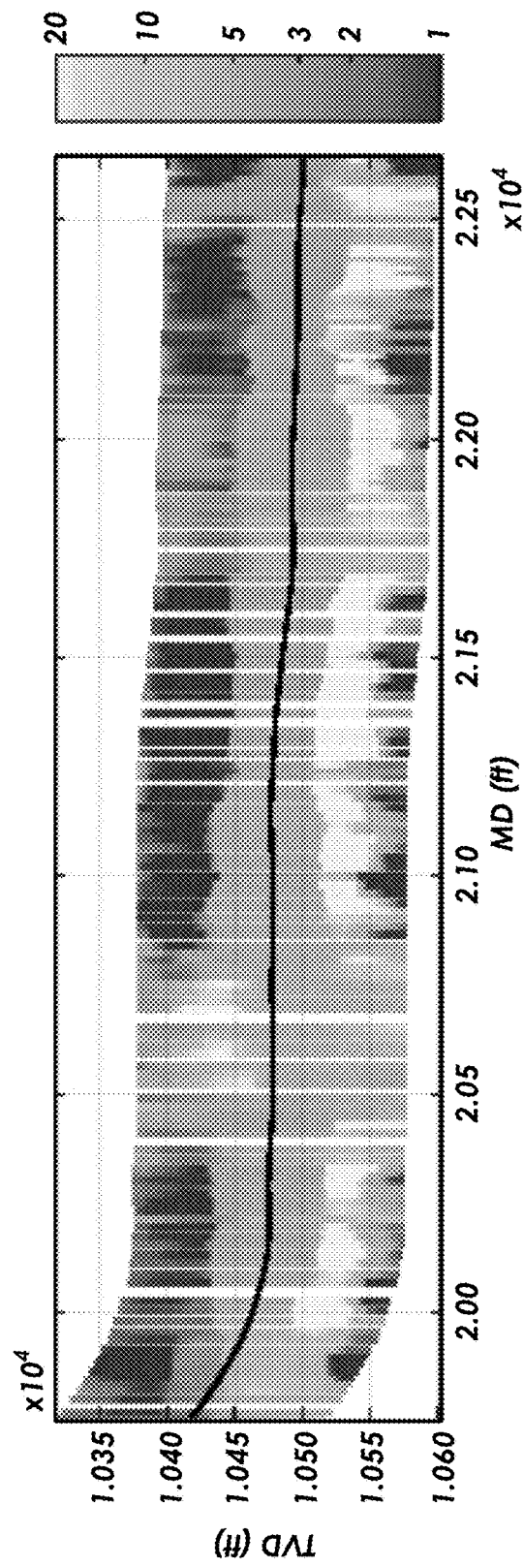
FIG. 9 illustrates a Rh curtain section from a median solution.
Figure 10:
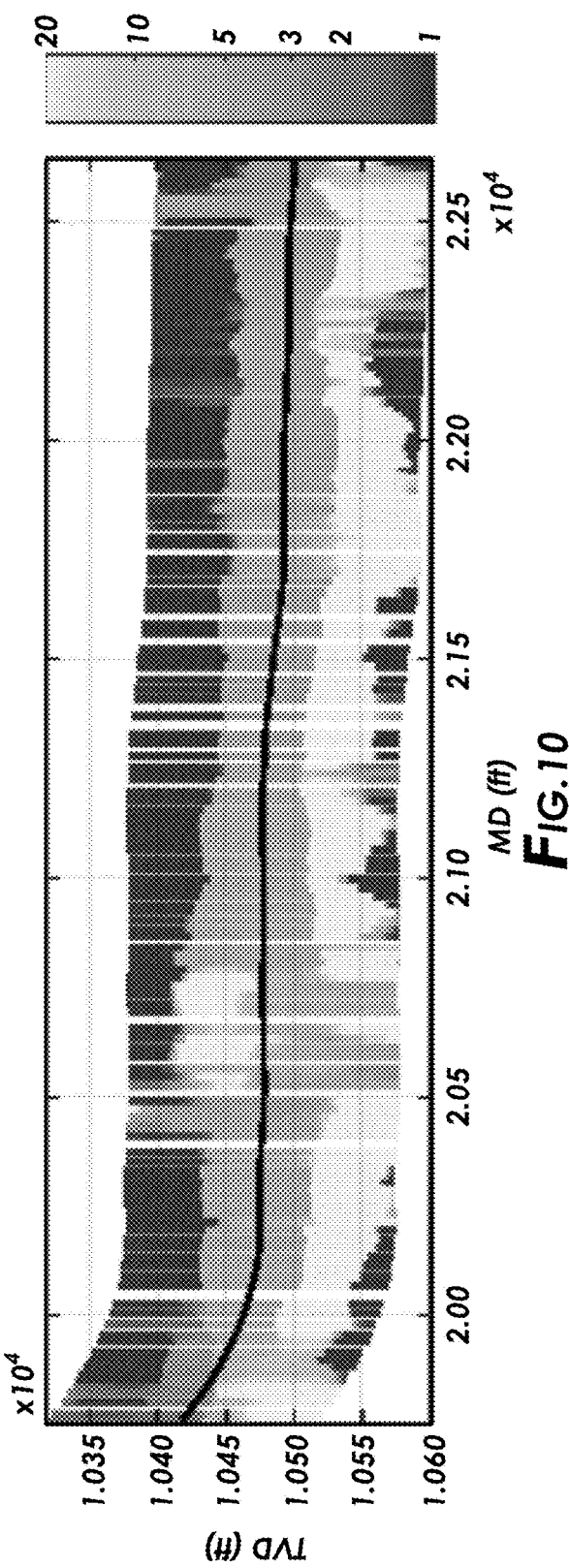
FIG. 10 illustrates a Rh curtain section after processing according to similarity and continuity.

FIGS. 9 and 10 show the results before and after this automatic processing. FIG. 9 shows the Rh curtain section from the median solution at each depth and FIG. 10 shows the Rh curtain section after processing according to similarity and continuity. Different formation layers may be identifiable and continuous after the processing in FIG. 10.

It should be noted that current technology only performs post processing of inversion results. For example, at each logging point, the inversion results are group into clusters based on similarity between each inversion result. A user may then pick a cluster at one logging point and a centroid of the cluster will be the final solution. The selected solution at one point will be used to select the solution cluster at other logging points based on the similarity between centroids at each logging point.

Referring back to FIG. 8, machine learning workflow 800 may "train" the inversion from the beginning at the stage of generating initials. If the measurements at the current logging point only have very small differences from previous logging point. The inversion may directly start from those initials used by the inversion at the previous point. There is no need to generate and evaluate the initials for the current point, which may reduce computational time by about 50%.

Machine learning workflow 800 may also be applied to the post processing part of our inversion. Once a solution has been selected at one logging point, it is used to evaluate all the inversion results (not just the cluster centroid) at its adjacent logging points by the correlation between two solutions based on their boundary locations or geological patterns. The final solutions may be accumulated while the post processing moves to more logging points, which may train the algorithm to automatically select the most relevant solution at each logging point.

Figure 11:
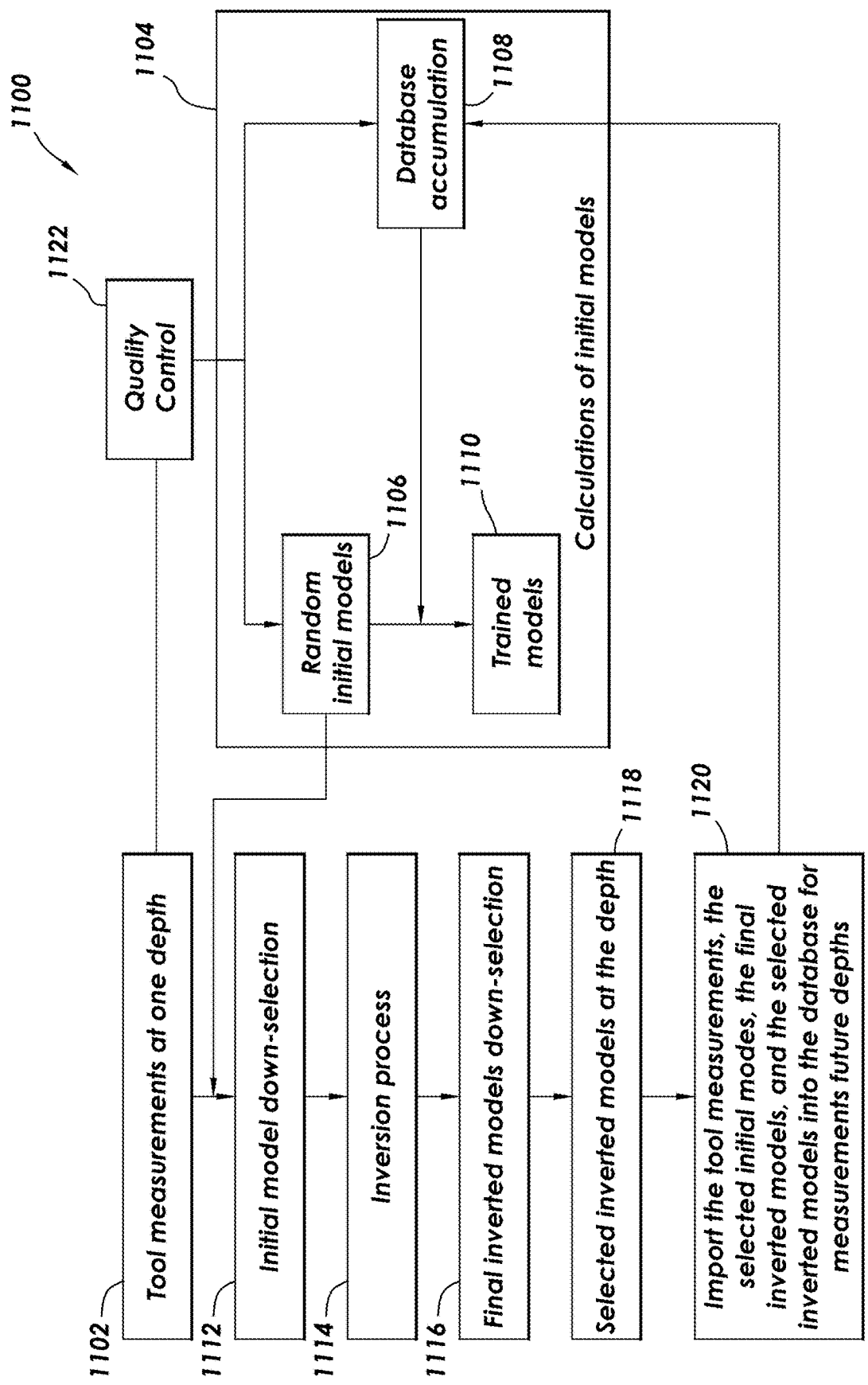
FIG. 11 illustrates inversion an example of a workflow which may produce randomized initial models used in an inversion process.

FIG. 11 illustrates inversion workflow 1100, which may utilize randomized initial models used in the inversion process. Workflow 1100 may begin with block 1102, in which information handling system 120 (e.g., referring to FIG. 1) may collect inversion results from all initial modes for at least one depth. In block 1104, the collected inversion results from block 1102 may be used to calculate initial models. As illustrated, block 1104 may include several different blocks. For example, random models may be created in block 1106 and in block 1108 may populate a database during a database accumulation operation. The initial models from block 1106 and information from the databased in block 1108 may be used in block 1110 to train models. Additionally, initial models from block 1106 may be used with block 1112. In block 1112, initial models from block 1106 may be reviewed for selection. Once one or more initial models from block 1106 are selected, in block 1114 an inversion process is performed with the selected initial models. In block 1116, results from the inversion process may be used to choose a final inverted model. Results from block 1116 may be used to in block 1118 to select inversion models that may work the best at the measurement depth in block 1112. In block 1120, the tool measurements from block 1102, the selected initial models in block 1112, the final inverted models in block 1116, and the selected inverted models in block 1118 are stored in a database for measurements at future depths. It should be noted that the database may be the same database in block 1108. Additionally, before measurements are stored in a database, the measurements may go through block 1122 for quality control. Without limitation, quality control methods may be determined from the gain information of the tools, azimuthal responses of the tools while rotation, the signal-to-noise ratio (SNR) of the tool measurements, and/or the like. In workflow 1100, the calculation of the initial models in block 1106 may take almost 50% of the calculations of the overall process. Therefore, the machine learning algorithms applied into the calculations of initial models in block 1106 may efficiently improve the overall calculation performance.

Figure 12:
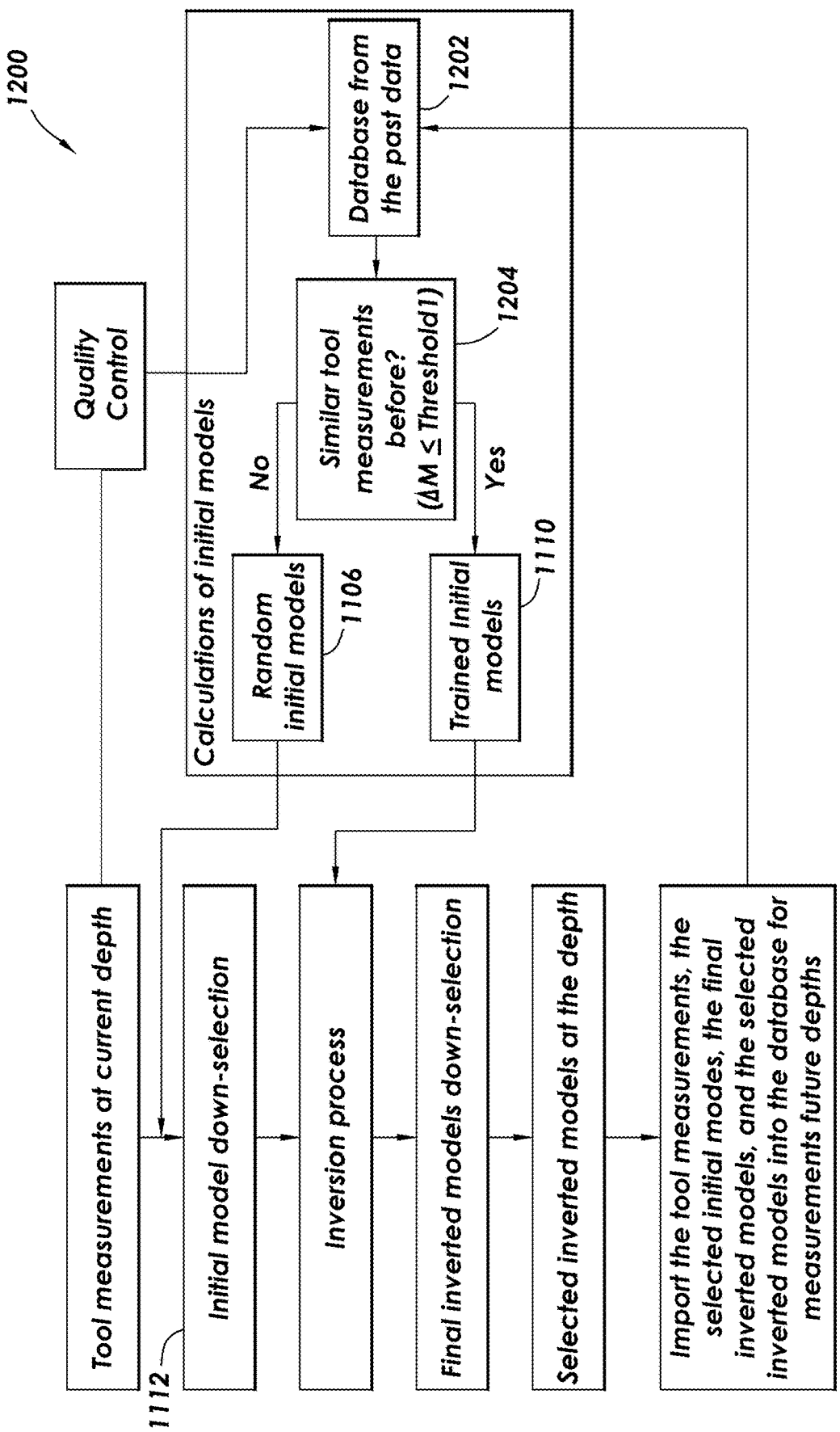
FIG. 12 illustrates another workflow which may utilize machine learning algorithms described above to skip randomized initial model calculations.

FIG. 12 illustrates workflow 1200 which may utilize machine learning algorithms described above to skip randomized initial model calculations. As illustrated in FIG. 12, all the information available from an existing inversion approaches from the past depths or from the past wells may be stored in a database in block 1202. It should be noted that the database in block 1108 of FIG. 11 and the database of block 1202 may be the same. The databased may be used to train the models, including initial model selection, the inverted models or even the final selected inverted models. Therefore, when a new set of tool measurements are collected, the measurements may be used and compared to the database in block 1202. In block 1204, if the different in measurements between two measurements depths is larger than the threshold, then random initial models may be created in block 1106, from which one or more initial models with small misfit less than a defined threshold are selected to perform inversion in block 1114. If measurements between two different measurement depth are similar (assuming the difference is smaller than certain defined threshold, smaller than Threshold 1 in block 1204) to some set of past tool measurements in the database of block 1202, information form the database may be used in block 1110 to train models. Inputting information from the database in block 1202 to train initial models in block 1110 may allow for direct inversion process in block 1114 instead of reviewing and selecting models in block 1112, as described above in FIG. 11. Inputting information from the database in block 1202 directly into trained models in block 1110 may save about 40% of calculation time.

Figure 13:
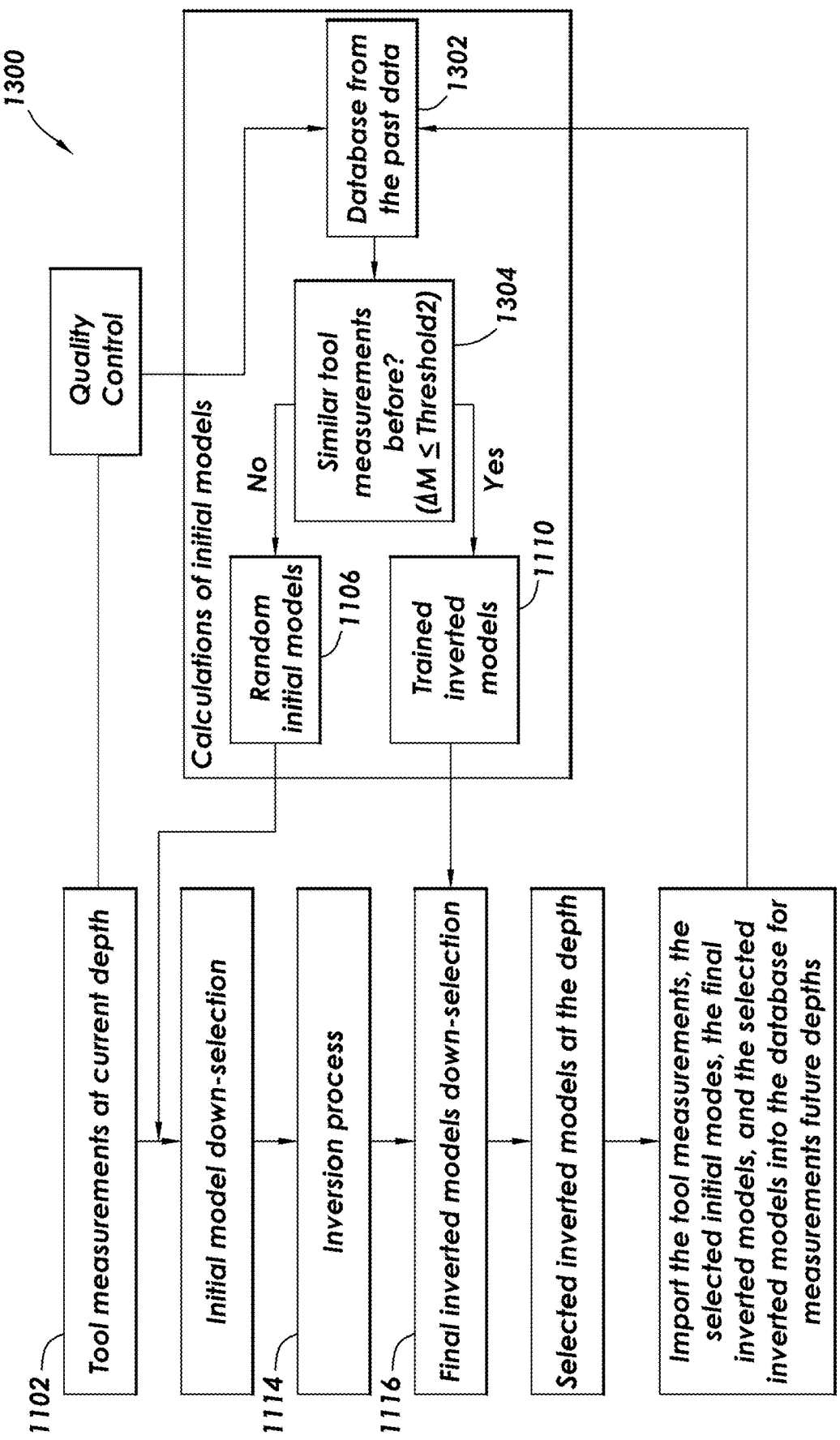
FIG. 13 illustrates another workflow which may utilize machine learning algorithms described above to skip randomized initial model calculations and an inversion process.

FIG. 13 illustrates workflow 1300 which may utilize machine learning algorithms described above to skip randomized initial model calculations and an inversion process. As illustrated, in block 1304 if the difference between the current tool measurements and the measurements from the past data in the database of 1302 is even smaller than Threshold 2 in block 1304, then the inversion process of block 1114 may be skipped and results from trained inverted models in block 1110 may go directly to block 1116 for a final inverted model down-selection. It should be noted, that the down-selection criterions in block 1116 may be based on inverted models from the database in block 1302 and tool measurements from block 1102 at the current depth to define which inverted models may be the best fitted models for the final inversion results. Speeding up the workflow in FIG. 13 by skipping the inversion process in block 1114 may be 10% more faster in additional to the speed-up from workflow 1200 in FIG. 12.

Figure 14:
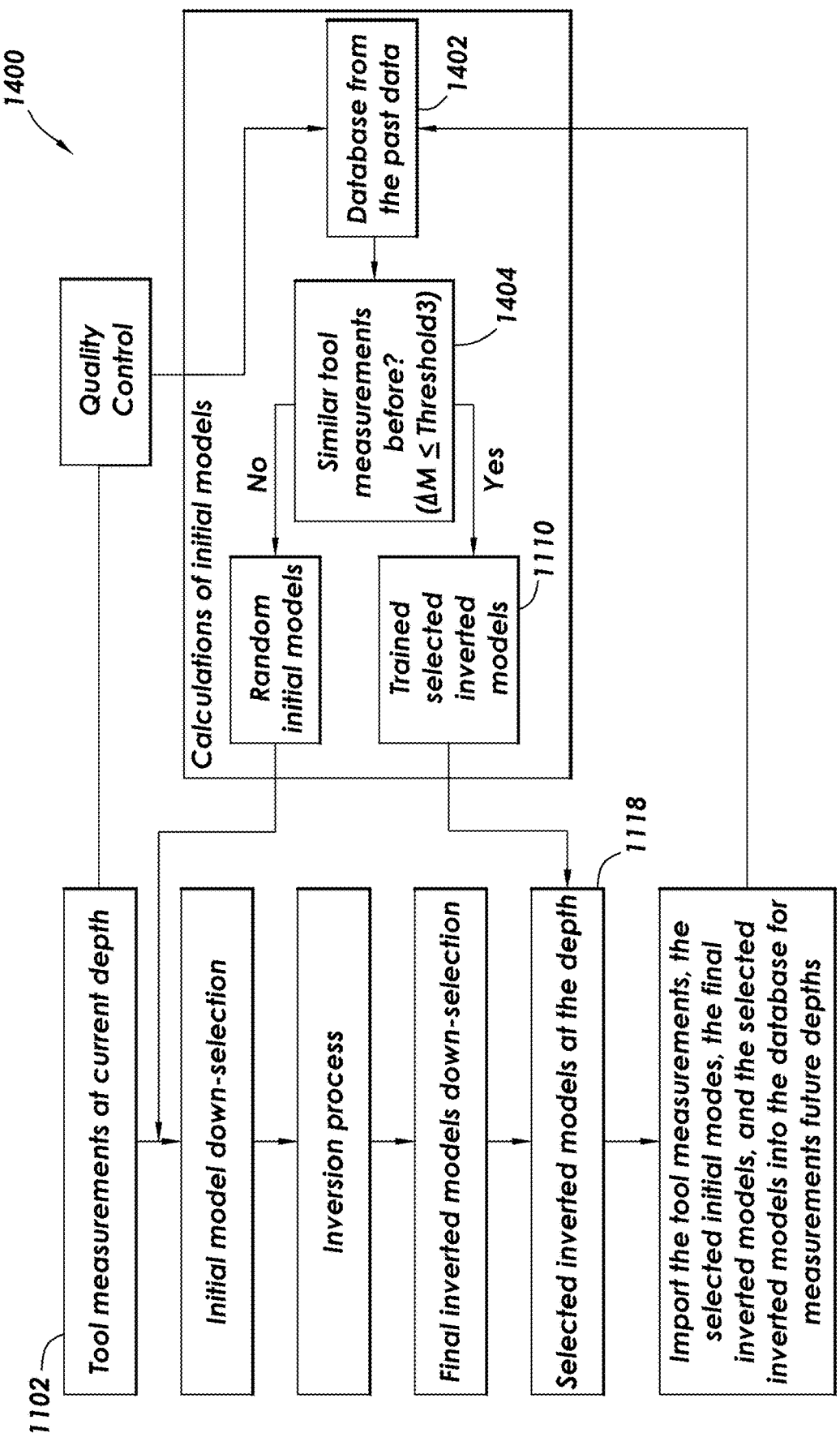
FIG. 14 illustrates another workflow which may utilize machine learning algorithms described above to perform the workflow without performing calculations.

FIG. 14 illustrates workflow 1400 which may utilize machine learning algorithms described above to perform workflow 1400 without performing calculations. As illustrated, if measurements from block 1102 may be similar to any particular dataset in a database of block 1402 (i.e., smaller than Threshold 3 in block 1404), results from block 1110 may be entered directly into block 1118 for selecting inverted models using the machine learning algorithms. It is noted that roughly Threshold1 is around 10 dB/10 deg, Threshold2 is around 2 dB/2 deg and Threshold3 is around 1 dB/1 deg, and Threshold1>Threshold2>Threshold3 in the machine learning algorithms.

In addition, the similarity among each model of block 1110 from past data may be determined so that the correct model for at a measurement depth may be determine, to be used based on the difference between the new set of measurements and the measurements in the database. With respect to how to calculate the similarity of each models, a determination is made as to model distributions based on the pixelated inversion results. The similarity between any new model and the most likely model distributions is determined if any new model is similar to the most likely model distribution. Similarity between any new model to the most likely modes distribution is defined as the difference between the two modes is less than a defined threshold. In addition, the most likely model distributions may be a user input model as a reference model for similarity calculations.

This method filters the inversion solutions based on similarity between continuous depths and already known geology information that may be available. The final inversion results after post-processing is not only smoother but may provide distinguishable formation structures. It should further be noted that it may help geo-steering engineers to improve their understanding of the geology and better facilitate the well drilling. This method and system of machine learning to improve inversion results may include any of the various features of the compositions, methods, and system disclosed herein, including one or more of the following statements.

Statement 1. A method for selecting initial models or inversion solutions during an inversion process from electromagnetic measurements may comprise disposing an electromagnetic well measurement system into a wellbore, wherein the electromagnetic well measurement system comprises: an electromagnetic transmitter antenna, an electromagnetic receiver antenna, transmitting electromagnetic fields into a formation with the electromagnetic transmitter; measuring the electromagnetic fields with the electromagnetic receiver as measurements at a depth in the wellbore; forming initial models for the inversion process based on the measurements and performing an inversion; filtering an inversion solution; forming a solution database from the filtered inversion solutions; building a reference model; calculating a similarity between the reference model and one or more models in the solution database; selecting one or more results from the solution database with the similarity larger than a threshold; and generating a final inversion model image from the one or more results.

Statement 2. The method of statement 1, wherein the reference model is a median, average, filtered results from the solution database, a prior information model, or a user defined model.

Statement 3. The method of any previous statements, wherein the threshold is three times of a minimum misfit of the inversion results.

Statement 4. The method of any previous statements 1, further comprising measuring the electromagnetic fields with the electromagnetic receiver as second measurements at a second depth in the wellbore.

Statement 5. The method of statement 4, further comprising calculating the similarity between the measurements to the second measurements to determine a difference.

Statement 6. The method of statement 5, further comprising comparing the difference to the threshold.

Statement 7. The method of statement 6, further comprising filtering the inversion solutions with the final inversion model if the difference is below the threshold.

Statement 8. The method of statement 6, further comprising using the final inversion model if the difference is below the threshold.

Statement 9. The method of statement 6, further comprising using the measurements if the difference is below the threshold.

Statement 10. The method of statements 2-4, further comprising calculating the reference model from the solution database from previous depths.

Statement 11. The method of statements 2-4 or 10, further using the reference model to attain better selections on the inversion solutions.

Statement 12. The method of statements 2-4, 10, or 11, further comprising performing a misfit process which includes a misfit threshold.

Statement 13. An electromagnetic well measurement system may comprise an electromagnetic transmitter antenna for transmitting electromagnetic fields into formation, an electromagnetic receiver antenna for measuring the electromagnetic fields as measurements at a depth; and an information handling system configured to: form initial models for an inversion process based on the measurements and performing an inversion; filter one or more inversion solutions with a misfit process of comparing to the measurement to form solution database; build a reference model; calculate a similarity between the reference model and each model in the solution database; select one or more results from the solution database with the similarity larger than a threshold; and generate a final inversion model image from the one or more results.

Statement 14. The electromagnetic well measurement system of statement 13, wherein the information handling system is further configured to calculate the similarity between second measurements from a second depth to the measurements to determine a difference and compare the difference to the threshold.

Statement 15. The electromagnetic well measurement system of statements 13 or 14, wherein the information handling system is further configured to filter the one or more inversion solutions with the final inversion model if a difference is below the threshold.

Statement 16. The electromagnetic well measurement system of statements 13 to 15, wherein the information handling system is further configured to use the final inversion model if a difference is below the threshold.

Statement 17. The electromagnetic well measurement system of statements 13 to 16, wherein the information handling system is further configured to use a first measurement if a difference is below the threshold.

Statement 18. A method for selecting initial models or inversion solutions during an inversion process from electromagnetic measurements may comprise comparing at least one measurement at a depth to a database that includes one or more depth measurements from a past depth or a past well; calculating a similarity between the at least one measurement and the one or more depth measurements; forming initial models for an inversion process based at least in part on a database; performing the inversion; filtering the inversion solutions; building a reference model; calculating a similarity between the reference model and the database; selecting one or more results from the database with the similarity larger than a threshold; and generating a final inversion model image from the one or more results.

Statement 19. The method of statement 18, wherein the performing the inversion is performed with a selected model from the past depth or the databased from a previous well if a difference is below the threshold.

Statement 20. The method of statements 18 or 19, further comprising using the final inversion model based at least in part on a final inversion model from the past depth or the past well if a difference is below the threshold.

The preceding description provides various examples of the systems and methods of use disclosed herein which may contain different method steps and alternative combinations of components. It should be understood that, although individual examples may be discussed herein, the present disclosure covers all combinations of the disclosed examples, including, without limitation, the different component combinations, method step combinations, and properties of the system. It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the element that it introduces.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present examples are well adapted to attain the ends and advantages mentioned as well as those that are inherent therein. The particular examples disclosed above are illustrative only and may be modified and practiced in different but equivalent manners apparent to those skilled in the art having the benefit of the teachings herein. Although individual examples are discussed, the disclosure covers all combinations of all of the examples. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative examples disclosed above may be altered or modified and all such variations are considered within the scope and spirit of those examples. If there is any conflict in the usages of a word or term in this specification and one or more patent(s) or other documents that may be incorporated herein by reference, the definitions that are consistent with this specification should be adopted.

What is claimed is:

1. A method for selecting initial models or inversion solutions during an inversion process from electromagnetic measurements comprising:
    disposing an electromagnetic well measurement system into a wellbore, wherein the electromagnetic well measurement system comprises:
    an electromagnetic transmitter antenna,
    an electromagnetic receiver antenna,
    transmitting electromagnetic fields into a formation with the electromagnetic transmitter;
    measuring the electromagnetic fields with the electromagnetic receiver as measurements at a depth in the wellbore;
    forming initial models for the inversion process based on the measurements and performing an inversion;
    filtering an inversion solution;
    forming a solution database from the filtered inversion solutions;
    building a reference model;
    calculating a similarity between the reference model and one or more models in the solution database;
    selecting one or more results from the solution database with the similarity larger than a threshold; and
    generating a final inversion model image from the one or more results.

2. The method of claim 1, wherein the reference model is a median, average, filtered results from the solution database, a prior information model, or a user defined model.

3. The method of claim 1, wherein the threshold is three times of a minimum misfit of the inversion results.

4. The method of claim 1, further comprising measuring the electromagnetic fields with the electromagnetic receiver as second measurements at a second depth in the wellbore.

5. The method of claim 4, further comprising calculating the similarity between the measurements to the second measurements to determine a difference.

6. The method of claim 5, further comprising comparing the difference to the threshold.

7. The method of claim 6, further comprising filtering the inversion solutions with the final inversion model if the difference is below the threshold.

8. The method of claim 6, further comprising using the final inversion model if the difference is below the threshold.

9. The method of claim 6, further comprising using the measurements if the difference is below the threshold.

10. The method of claim 1, further comprising calculating the reference model from the solution database from previous depths.

11. The method of claim 1, further using the reference model to attain better selections on the inversion solutions.

12. The method of claim 1, further comprising performing a misfit process which includes a misfit threshold.

13. An electromagnetic well measurement system comprising:
    an electromagnetic transmitter antenna for transmitting electromagnetic fields into formation,
    an electromagnetic receiver antenna for measuring the electromagnetic fields as measurements at a depth; and an information handling system configured to:
  form initial models for an inversion process based on the measurements and performing an inversion;
  filter one or more inversion solutions with a misfit process of comparing to the measurement to form solution database;
  build a reference model;
  calculate a similarity between the reference model and each model in the solution database;
  select one or more results from the solution database with the similarity larger than a threshold; and
  generate a final inversion model image from the one or more results.

14. The electromagnetic well measurement system of claim 13, wherein the information handling system is further configured to calculate the similarity between second measurements from a second depth to the measurements to determine a difference and compare the difference to the threshold.

15. The electromagnetic well measurement system of claim 13, wherein the information handling system is further configured to filter the one or more inversion solutions with the final inversion model if a difference is below the threshold.

16. The electromagnetic well measurement system of claim 13, wherein the information handling system is further configured to use the final inversion model if a difference is below the threshold.

17. The electromagnetic well measurement system of claim 13, wherein the information handling system is further configured to use a first measurement if a difference is below the threshold.

18. A method for selecting initial models or inversion solutions during an inversion process from electromagnetic measurements comprising:
  comparing at least one measurement at a depth to a database that includes one or more depth measurements from a past depth or a past well;
  calculating a similarity between the at least one measurement and the one or more depth measurements;
  forming initial models for an inversion process based at least in part on a database;
  performing the inversion;
  filtering the inversion solutions;
  building a reference model;
  calculating a similarity between the reference model and the database;
  selecting one or more results from the database with the similarity larger than a threshold; and
  generating a final inversion model image from the one or more results.

19. The method of claim 18, wherein the performing the inversion is performed with a selected model from the past depth or the databased from a previous well if a difference is below the threshold.

20. The method of claim 18, further comprising using the final inversion model based at least in part on a final inversion model from the past depth or the past well if a difference is below the threshold.

* * * * *